United States Patent
Enmoto et al.

(10) Patent No.: US 6,700,059 B1
(45) Date of Patent: Mar. 2, 2004

(54) SHEET METAL, METHOD OF MANUFACTURING THREE-DIMENSIONAL STRUCTURE, THREE-DIMENSIONAL STRUCTURES, AND ELECTRONIC DEVICE

(75) Inventors: Kazuo Enmoto, Tokyo (JP); Masanori Itou, Tokyo (JP); Akihiro Iriguchi, Tokyo (JP); Hiroki Mori, Tokyo (JP)

(73) Assignee: NEC Mitsubishi Electric Visual Systems Corporation, Tokyo (JP)

( * ) Notice: Subject to any disclaimer, the term of this patent is extended or adjusted under 35 U.S.C. 154(b) by 244 days.

(21) Appl. No.: 10/018,458

(22) PCT Filed: Dec. 19, 2001

(86) PCT No.: PCT/JP00/04072

§ 371 (c)(1),
(2), (4) Date: Dec. 19, 2001

(87) PCT Pub. No.: WO01/97997

PCT Pub. Date: Dec. 27, 2001

(51) Int. Cl.7 ................................................ H05K 9/00
(52) U.S. Cl. ........................... 174/35 R; 174/35 MS; 428/596
(58) Field of Search ................ 174/35 R, 35 MS, 174/35 GC; 428/175, 596, 597, 229; 361/816, 818

(56) References Cited

U.S. PATENT DOCUMENTS

| 3,206,536 A | * | 9/1965 | Goodloe ............... 174/35 GC |
| 3,546,075 A | * | 12/1970 | Sheetz et al. ............... 428/596 |
| 3,642,550 A | * | 2/1972 | Doll ........................... 156/78 |
| 4,221,032 A | | 9/1980 | Cousino et al. |
| 4,390,599 A | * | 6/1983 | Broyles ...................... 428/597 |
| 4,678,699 A | * | 7/1987 | Kritchevsky et al. ....... 428/175 |

FOREIGN PATENT DOCUMENTS

| JP | 52-78749 | | 7/1977 |
| JP | 55-142609 | A | 11/1980 |
| JP | 56-15160 | B2 | 4/1981 |
| JP | 58-32529 | A | 2/1983 |
| JP | 59-13529 | A | 1/1984 |
| JP | 4-238636 | A | 8/1992 |

* cited by examiner

*Primary Examiner*—Dean A. Reichard
*Assistant Examiner*—Carmelo Oliva
(74) *Attorney, Agent, or Firm*—Birch, Stewart, Kolasch & Birch, LLP

(57) ABSTRACT

The present invention belongs to a technical field for manufacturing a three-dimensional structure for an electronic device such as a radio wave shielding member through extension working of a metal plate having cuts. In conventional three-dimensional working of a metal plate, there is a problem in that a non-extension portion is wrinkled depending on extension of a cut. In the present invention, a connecting portion (3) extended in a second direction (D2) is provided at an equal pitch (p) in a first direction (D1) through an opening (4) having a rectangular cross-section in an intermediate portion (PB) between a cut forming portion (PC) having cuts (2) provided like a zigzag in the first direction (D1) and a non-extension portion (PA) having no cut in a metal plate (1). Consequently, even if the cut forming portion (PC) is extended, the connecting portion (3) is simply squashed and contracted and a boundary line (BL) portion is not deformed.

7 Claims, 9 Drawing Sheets

SHEET METAL, METHOD OF MANUFACTURING THREE-DIMENSIONAL STRUCTURE, THREE-DIMENSIONAL STRUCTURES, AND ELECTRONIC DEVICE

This application is the national phase under 35 U.S.C. §371 of PCT International Application No. PCT/JP00/04072 which has an International filing date of Jun. 21, 2000, which designated the United States of America.

TECHNICAL FIELD

The present invention relates to a technique for manufacturing a three-dimensional structure to be used for a radio wave shield of an electronic device or the like through three-dimensional working for a metal plate, and furthermore, to a metal plate structure therefor.

BACKGROUND ART

Various methods have been proposed for manufacturing a shield housing for shielding a radiated radio wave (electromagnetic wave) generated from an electronic device such as a cathode-ray tube by using three-dimensional working for a metal plate.

For example, there has been a method of fabricating a box-shaped shield housing by cutting a development of the shield housing out of a metal plate and bending a boundary line portion of the development and then bonding a junction portion with a rivet, a screw or the like. However, this method has a problem in that the number of steps is necessarily increased and a dividing loss is caused by cutting out the development.

On the other hand, there has been proposed a method of manufacturing a three-dimensional structure by extruding a part of a metal plate through press working to form a projection. According to such a method, the above-mentioned problem does not arise. In this method, however, there is a problem in that it is hard to maintain a very large amount of extension such that the projection has a height of 5 cm or more, for example.

Japanese Patent Publication No. Sho 56–15160 has proposed an improved method of increasing the amount of extension by making the most of the advantages of the above-mentioned method, that is, the three-dimensional extension working of the metal plate. In this method, a large number of cuts are previously provided concentrically like a zigzag in a shield portion (an extension portion) between an inner peripheral edge (a non-extension portion) and an outer peripheral edge (a non-extension portion) of a metal plate to be a metallic flat plate. By stretching both edges to be separated from each other, the shield portion is extended to form a three-dimensional structure. At this time, each cut is expanded to be a meshed portion. According to such a method, a height of the extended shield portion can be set to 5 cm or more, for example.

However, the improved method has a new problem due to the provision of many zigzag cuts in the extension portion of the metal plate. This respect will be described below with reference to FIGS. 9 and 10.

FIG. 9 is an enlarged plan view showing a part of a boundary portion of a non-extension portion PAP and an extension portion PCP of a metal plate which has not been extended, and the designation 2P denotes a cut. Moreover, FIG. 10 is an enlarged plan view showing a part of a boundary portion of a non-extension portion PAP1 and an extension portion PCP1 of the metal plate which has been extended, and the designation 2P1 denotes a cut obtained after the extension. As shown in FIG. 9, the metal plate is basically extended in a direction of an arrow b in the ordinary extension. As a result, the extension portion PCP1 is apt to be contracted in a direction of an arrow a (in a transverse direction of the drawing) as shown in FIG. 10. Therefore, a strain is generated in a boundary portion of the portion PAP having no cut which does not need to be extended and the portion PCP to be extended and the non-extension portion PAP1 of the three-dimensional structure thus formed is wrinkled. For this reason, there is a problem in that a step of smoothing out the wrinkle generated in the non-extension portion PAP1 by using a roller or the like is further required after the extension.

DISCLOSURE OF THE INVENTION

The present invention has been made in order to solve the above-mentioned problems and has an object to prevent a boundary portion of an extension portion and a non-extension portion from being contracted due to generation of a wrinkle in the non-extension portion when three-dimensionally extending a metal plate having a cut to manufacture a three-dimensional structure.

A first aspect of the present invention is directed to a metal plate to be used for manufacturing a three-dimensional structure through three-dimensional extension, comprising a first portion which does not have cuts at all, a second portion connected to the first portion, and a third portion connected to a portion in the second portion on an opposite side of a boundary line of the first portion and the second portion and having the cuts arranged like a zigzag in a first direction parallel with the boundary line, the second portion comprising a plurality of connecting portions extended in a second direction orthogonal to the first direction on the same plane and connecting a portion in the second portion on the boundary line side and the third portion, and a plurality of openings arranged in the first direction, each of which is interposed between connecting portions adjacent to each other out of said plurality of connecting portions.

A second aspect of the present invention is directed to the metal plate according to the first aspect, further comprising a fourth portion which is connected to a portion in the third portion on an opposite side of a connecting portion of the second portion and the third portion, and a fifth portion which is connected to a portion in the fourth portion on an opposite side of a connecting portion of the third portion and the fourth portion and does not have the cuts at all, wherein the plurality of connecting portions and the plurality of openings in the second portion are defined as a plurality of first connecting portions and a plurality of first openings, respectively, the fourth portion comprises a plurality of second connecting portions extended in the second direction and connecting the opposite side portion of the third portion to a portion in the fourth portion on a boundary line side of the fourth portion and the fifth portion, and a plurality of second openings arranged in the first direction, each of which is interposed between second connecting portions adjacent to each other out of the plurality of second connecting portions.

A third aspect of the present invention is directed to the metal plate according to the second aspect, wherein the plurality of first connecting portions are provided at an equal pitch, an end on the third portion side of each of the copy first connecting portions is positioned above a central part of an edge in the first direction of a first cut which is the closest to the opposite side portion of the second portion out of the cuts, the plurality of second connecting portions are provided at an equal pitch, and an end on the third portion side of each of the plurality of second connecting portions is positioned above a central part of an edge in the first direction of a second cut which is the closest to the connecting portion of the third portion and the fourth portion out of the cuts.

A fourth aspect of the present invention is directed to the metal plate according to the third aspect, wherein a shape of each of the plurality of first connecting portions is a rectangular parallelepiped, a sectional shape of each of the plurality of first openings is a rectangle, a shape of each of the second connecting portions is a rectangular parallelepiped, and a sectional shape of each of the plurality of second openings is a rectangle.

A fifth aspect of the present invention is directed to a method of manufacturing a three-dimensional structure, comprising the steps of preparing the metal plate according to the third aspect, and extruding the fifth portion of the metal plate in a third direction orthogonal to the first direction and the second direction to extend the cuts, thereby processing the third portion into a meshed portion.

A sixth aspect of the present invention is directed to a three-dimensional structure manufactured by the method of manufacturing a three-dimensional structure according to the fifth aspect.

A seventh aspect of the present invention is directed to an electronic device comprising an electronic device body, and a radio wave shielding member constituted by the three-dimensional structure according to the sixth aspect.

According to each of the first aspect and the fifth to seventh aspects of the present invention, even if the third portion of the metal plate utilizing the cut is extended, a strain generated by the extension can be absorbed by the connecting portion and the opening in the second portion. Therefore, it is possible to inhibit a wrinkle from being generated in the first portion to be the non-extension portion, thereby preventing the boundary portion of the first portion and the extension portion from being deformed unnecessarily.

According to each of the second aspect and the fifth to seventh aspects of the present invention, even if the third portion of the metal plate utilizing the cut is extended, a strain generated by the extension can further be absorbed by the connecting portion and the opening in the fourth portion. Therefore, it is possible to inhibit a wrinkle from being generated in the fifth portion to be the non-extension portion, thereby preventing the boundary portion of the fifth portion and the extension portion from being deformed unnecessarily.

According to each of the third aspect and the fifth to seventh aspects of the present invention, the third portion can be extended such that each cut is a meshed portion having the same shape.

According to each of the fourth aspect and the fifth to seventh aspects of the present invention, it is possible to easily form the connecting portion and the opening in each of the second and fourth portions.

The above and other objects, features, aspects and advantages of the present invention will be described below in detail with reference to the accompanying drawings.

BEST MODE FOR CARRYING OUT THE INVENTION

Figure 10:
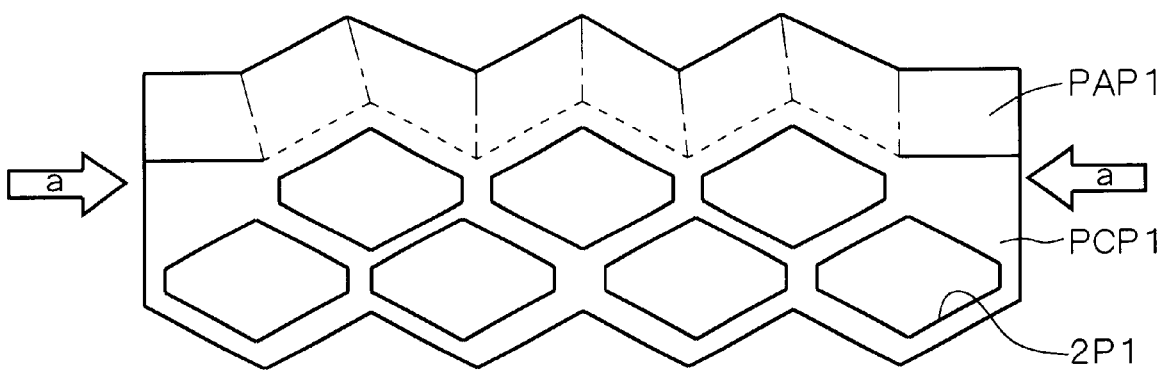
FIG. 10 is a plan view showing a problem generated when extending the conventional metal plate to process a three-dimensional structure.

In order to solve the problem described above with reference to FIG. 10, an embodiment of the present invention is characterized in that a connecting portion having such a shape as to be similarly squashed and contracted in a direction in which a cut portion is contracted (a direction of a in FIG. 10) when extending an extension portion having a cut or the cut portion is provided between a non-extension portion and the cut portion in a metal plate which has not been extended. A structure of a metal plate and a method of manufacturing a three-dimensional structure using the metal plate according to the present embodiment will be described below in detail with reference to the drawings. (First Embodiment)

Figure 1:
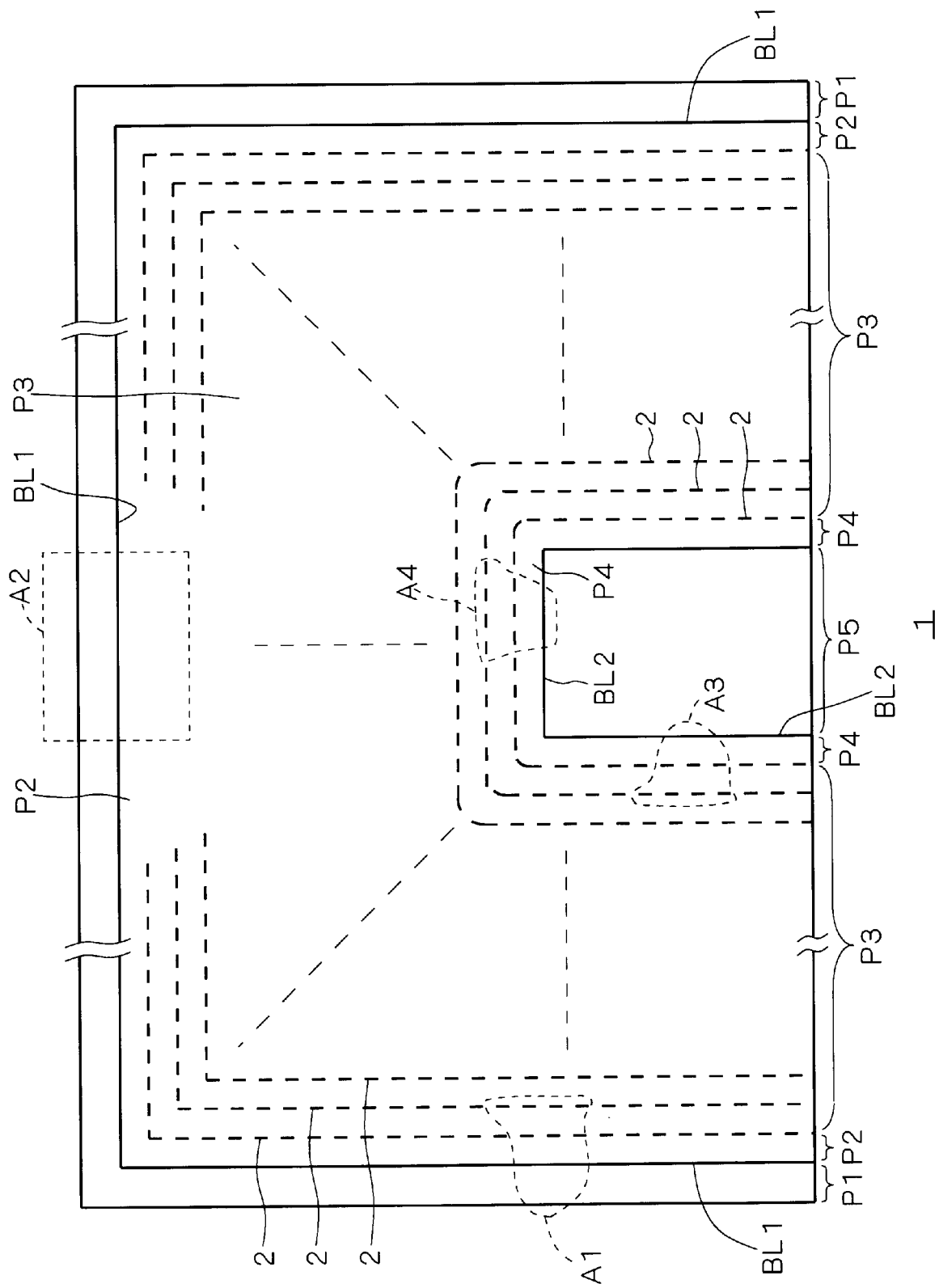
FIG. 1 is a plan view schematically showing a structure of a metal plate according to a first embodiment which has not been extended.

FIG. 1 is a plan view showing a structure of a metal plate 1 according to the present embodiment. In FIG. 1, a first portion PI forming an outer peripheral frame or an outer peripheral end of the metal plate 1 is a non-extension portion having no cut which will be described below. A second portion P2 connected to the first portion P1 through a first boundary line BL1 is formed on the inside of the first portion P1 in the metal plate 1. While the second portion P2 is one of features of the metal plate 1 and constitutes a part of an extension portion together with a third portion which will be described below, a specific structure thereof will be explained in the following description of FIG. 2. Furthermore, a third portion P3 connected to a portion in the second portion P2 on the opposite side of the first boundary line BL1 is formed on the inside of the second portion P2 of the metal plate 1. The third portion P3 constitutes a main part of the extension portion of the metal plate 1 and is provided with a plurality of cuts 2 arranged like a zigzag in a direction parallel with the first boundary line BL1 (a first direction). Moreover, a fourth portion P4 connected to a portion in the third portion P3 on the opposite side of the connecting portion of the second portion P2 and the third portion P3 is formed on the inside of the third portion P3 of the metal plate 1. The fourth portion P4 is also one of the features of the metal plate 1 and constitutes a part of the extension portion together with the second portion P2 and the third portion P3. In the same manner as the second portion P2, a specific structure of the fourth portion P4 will also be described in the following explanation of FIG. 2. Furthermore, a fifth portion P5 connected to a portion in the fourth portion P4 on the opposite side of the connecting portion of the third portion P3 and the fourth portion P4 is formed in a part of the metal plate 1 which is surrounded by the fourth portion P4. The fifth portion P5 is a non-extension portion which does not have the cut 2 at all. The designation BL2 denotes a second boundary line of the opposite side portion of the fourth portion P4 and the fifth portion P5.

Figure 2:
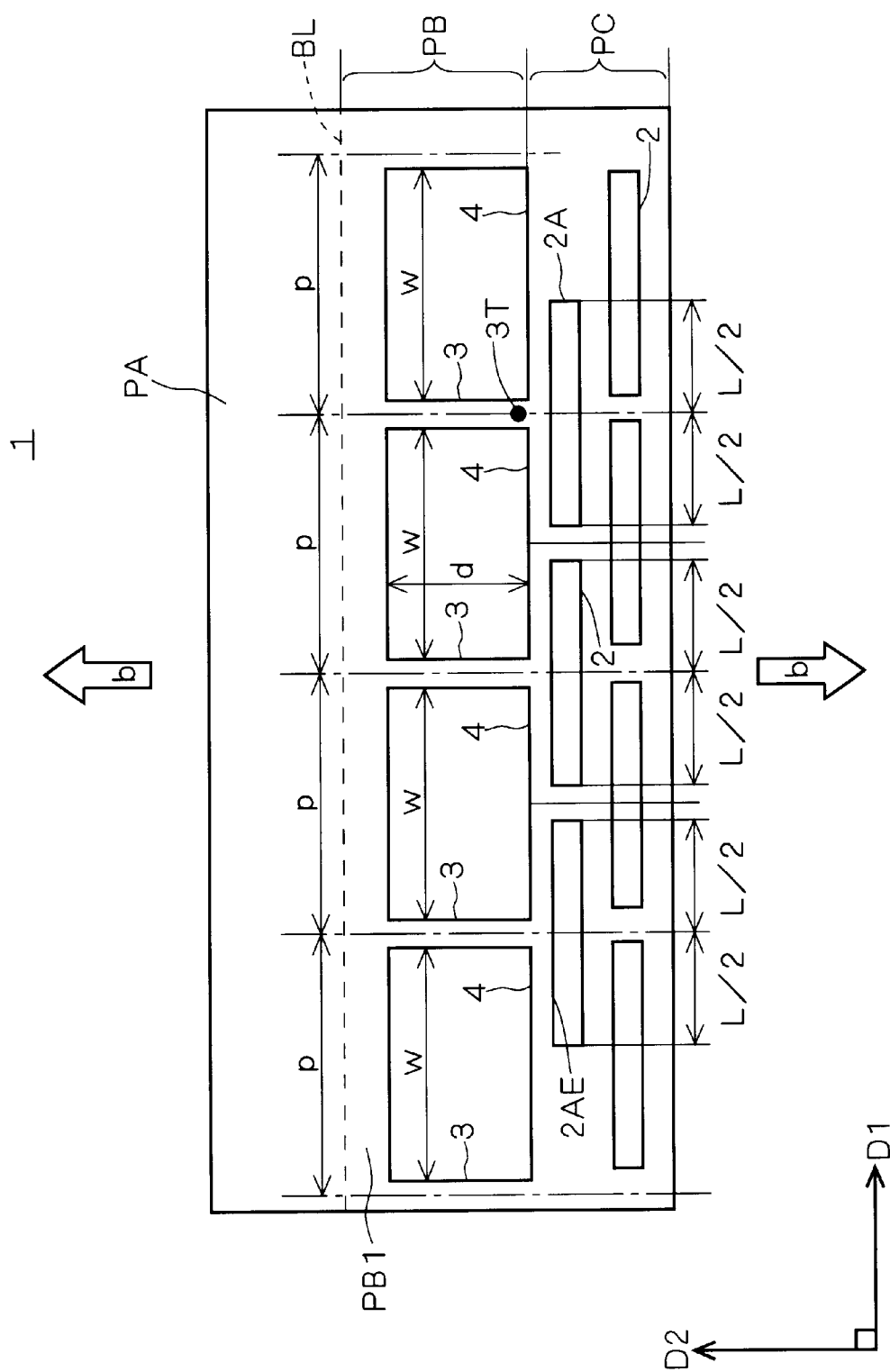
FIG. 2 is a plan view showing a connecting portion and an opening in the metal plate according to the first embodiment which has not been extended.

Structures of broken line portions A1 and A2 in FIG. 1 are identical to each other and FIG. 2 is a plan view showing the specific structures of both portions A1 and A2. A specific structure of the second portion P2 is apparent from FIG. 2 as follows.

In FIG. 2, a non-extension portion PA does not have the cut 2 at all and corresponds to the first portion P1 in FIG. 1. Moreover, an intermediate portion PB and a cut forming portion PC, which constitute an extension portion, correspond to the second portion P2 and the third portion P3 in FIG. 1 respectively and a boundary line BL corresponds to the first boundary line BL1 in FIG. 1. Furthermore, a first direction D1 corresponds to a direction parallel with the first boundary line BL1 in FIG. 1. Accordingly, the cut forming portion PC has a plurality of cuts 2 provided in the first direction D1 as described above like a zigzag in a second direction D2 orthogonal to the first direction D1 on the same plane. A length of each cut 2 in the first direction D1 is indicated as L. The cut 2 is a dent portion having a peripheral edge which is cut away from the metal plate 1 and is not completely separated from the metal plate 1. As a matter of course, a slit may be used in place of the cut 2 set in the state of the dent. In the present invention, a wide concept including the cut 2 set in the state of the dent and the slit will be generally referred to as a "cut".

Next, a structure of the intermediate portion PB to be a core part in FIG. 2 will be described. The intermediate portion PB is constituted by (i) a boundary line side portion PB1 connected to the non-extension portion PA through the boundary line BL, (ii) a plurality of connecting portions 3 extended in the second direction D2 and connecting an end of the boundary line side portion PB1 in the first direction D1 to the cut forming portion PC, and (iii) a plurality of openings 4 arranged in the first direction D1 to be interposed between the adjacent connecting portions 3. The connecting portion 3 and the opening 4 which are provided in the second portion P2 in FIG. 1 are defined as a "first connecting portion 3" and a "first opening 4", respectively. Each of the openings 4 is surrounded by the connecting portions 3 provided adjacently to each other, the end of the boundary line side portion PB1 in the first direction D1 and the cut forming portion PC, and furthermore, each section has a rectangular shape. A width in the first direction D1 is indicated as W and a width in the second direction D2 is indicated as d. Moreover, each of the connecting portions 3 has the shape of a rectangular parallelepiped, a length (in a longitudinal direction) of each connecting portion 3 in the second direction D2 is indicated as d, and a width of the connecting portion 3 in the first direction D1 has a constant value. In addition, a distance between centers of the adjacent connecting portions 3 is set to have an equal pitch p and an end 3T of the connecting portion 3 on the cut forming portion PC side is positioned above a central part of an edge 2AE in the first direction D1 of a cut (first cut) 2A in the cut 2 which is the closest to the connecting portion of the intermediate portion PB and the cut forming portion PC.

Figure 3:
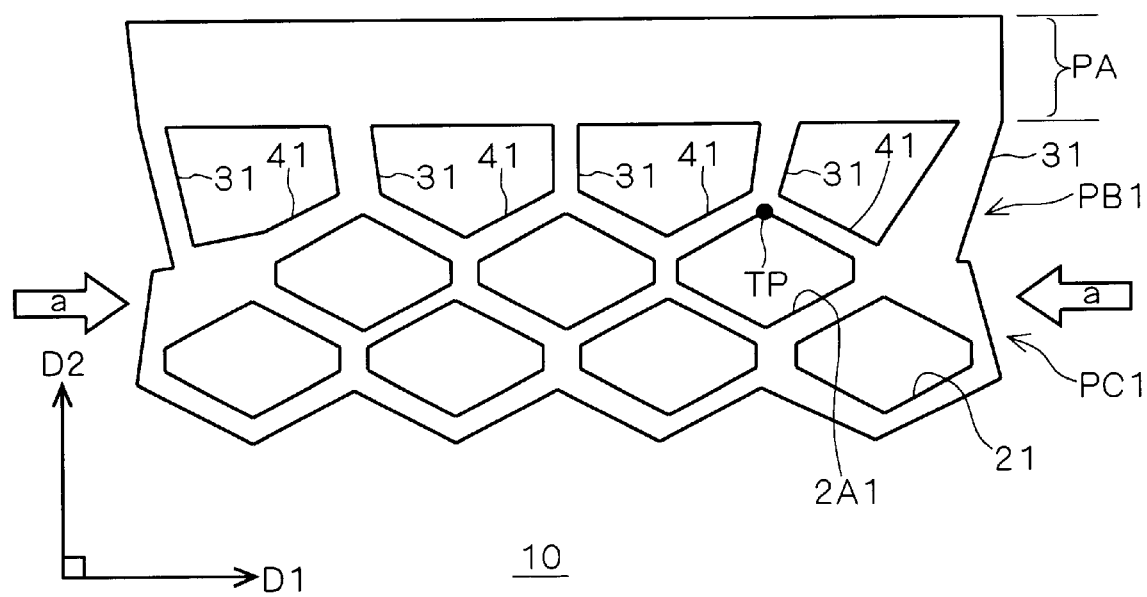
FIG. 3 is a plan view showing the connecting portion and the opening in the metal plate according to the first embodiment which has been extended.

As described above, the second portion P2 in FIG. 1, accordingly, the intermediate portion PB in FIG. 2 has a strain absorbing portion constituted by the connecting portion 3 and the opening 4. Therefore, when the metal plate 1 is extended in the direction of b in FIG. 2, the cut forming portion PC1 is squashed in the direction of a and cuts 21 and 2A1 are expanded to have cross-sectional shapes of a rhombus as shown in FIG. 3. At the same time, each connecting portion 31 of the intermediate portion PB1 is also squashed and contracted in the direction of a so that an opening 41 absorbs the strain and is deformed. As a result, it is possible to effectively inhibit the deformation caused by the strain in the direction of a from reaching the non-extension portion PA or the first portion P1 in FIG. 1, thereby preventing a wrinkle from being generated in the non-extension portion PA or the first portion P1 in FIG. 1. In other words, it is possible to prevent the vicinal portion of the boundary line of the first portion P1 and the second portion P2 in FIG. 1 from being deformed unnecessarily.

In addition, the distance between the centers of the adjacent connecting portions 3 is set to have the equal pitch p and the end 3T of the connecting portion 3 is positioned above the central part of the edge 2AE of the first cut 2A. As shown in FIG. 3, therefore, the deformed connecting portion 31 is connected to the corresponding cut 2A1 on a vertex portion TP of the cut 2A1 which is expanded to be meshed like a rhomboid, and the metal plate 1 can be extended in such a state that a load to be applied to each cut 2 is more reduced. As a result, the shapes of the cuts 21 and 2A 1 can be set to be identical to each other after the extension.

Moreover, structures of broken line portions A3 and A4 in FIG. 1 are identical to each other and the specific structures of both portions A3 and A4 are shown in the plan view of FIG. 2. Accordingly, the specific structure of the fourth portion P4 is also apparent from FIG. 2.

More specifically, in the description, the non-extension portion PA in FIG. 2 corresponds to the fifth portion P5 in FIG. 1, the intermediate portion PB and the cut forming portion PC correspond to the fourth portion P4 and the third portion P3 in FIG. 1 respectively, and the boundary line BL corresponds to the second boundary line BL2 in FIG. 1. Moreover, the first direction D1 in FIG. 2 corresponds to a direction parallel with the second boundary line BL2 in FIG. 1. The structure of the cut forming portion PC corresponding to the third portion P3 is described above, and the cuts 2 are provided along the second boundary line BL2 like a zigzag in the direction D2 orthogonal to the second boundary line BL2 on the same plane. Furthermore, the structure of the intermediate portion PB in FIG. 2 corresponding to the fourth portion P4 in FIG. 1 is also described above and is constituted by (i) the boundary line side portion PB1, (ii) a plurality of connecting portions 3 and (iii) a plurality of openings 4. In the description, the connecting portion 3 and the opening 4 in the fourth portion P4 in FIG. 1 are defined as a "second connecting portion 3" and a "second opening 4", respectively. The arrangement and shape of each of the second openings 4 are also identical to those of each of the first openings 4 described above. Moreover, the shape of each of the second connecting portions 3 or the like is also identical to that of each of the first connecting portions 3 or the like described above.

Accordingly, the fourth portion P4 in FIG. 1 also has a strain absorbing portion constituted by the connecting portion 3 and the opening 4 in FIG. 2. Therefore, when the metal plate 1 is extended in the direction of b in FIG. 2, the cut forming portion PC1 corresponding to the third portion P3 in FIG. 1 is squashed in the direction of a and each cut 21 is expanded to have a cross-sectional shape of a rhombus, each connecting portion 31 of the intermediate portion PB 1 corresponding to the fourth portion P4 in FIG. 1 is also squashed and contracted in the direction of a and the opening 41 absorbs the strain and is deformed as shown in FIG. 3. As a result, it is possible to effectively inhibit the deformation caused by the strain in the direction of a from reaching the non-extension portion PA or the fifth portion P5 in FIG. 1, thereby preventing a wrinkle from being generated in the non-extension portion PA or the fifth portion P5 in FIG. 1. In other words, it is possible to prevent the vicinal portion of the boundary line of the fifth potion P5 and the fourth portion P4 in FIG. 1 from being deformed unnecessarily. In addition, it is also possible to obtain the effect of making the shapes of the cuts 21 and 2A1 identical to each other after the extension.

Next, a method of manufacturing an example of a radio wave shield housing of an electronic device by carrying out three-dimensional extension working over the metal plate 1 in FIG. 1 will be described with reference to perspective views (process drawings) of FIGS. 4 and 5.

First of all, a die 20 such as a press machine and the metal plate 1 shown in FIG. 1 before the extension are prepared and the metal plate 1 is arranged in a predetermined installation location. At this time, the first portion P1 of the metal plate 1 is fixed.

Figure 4:
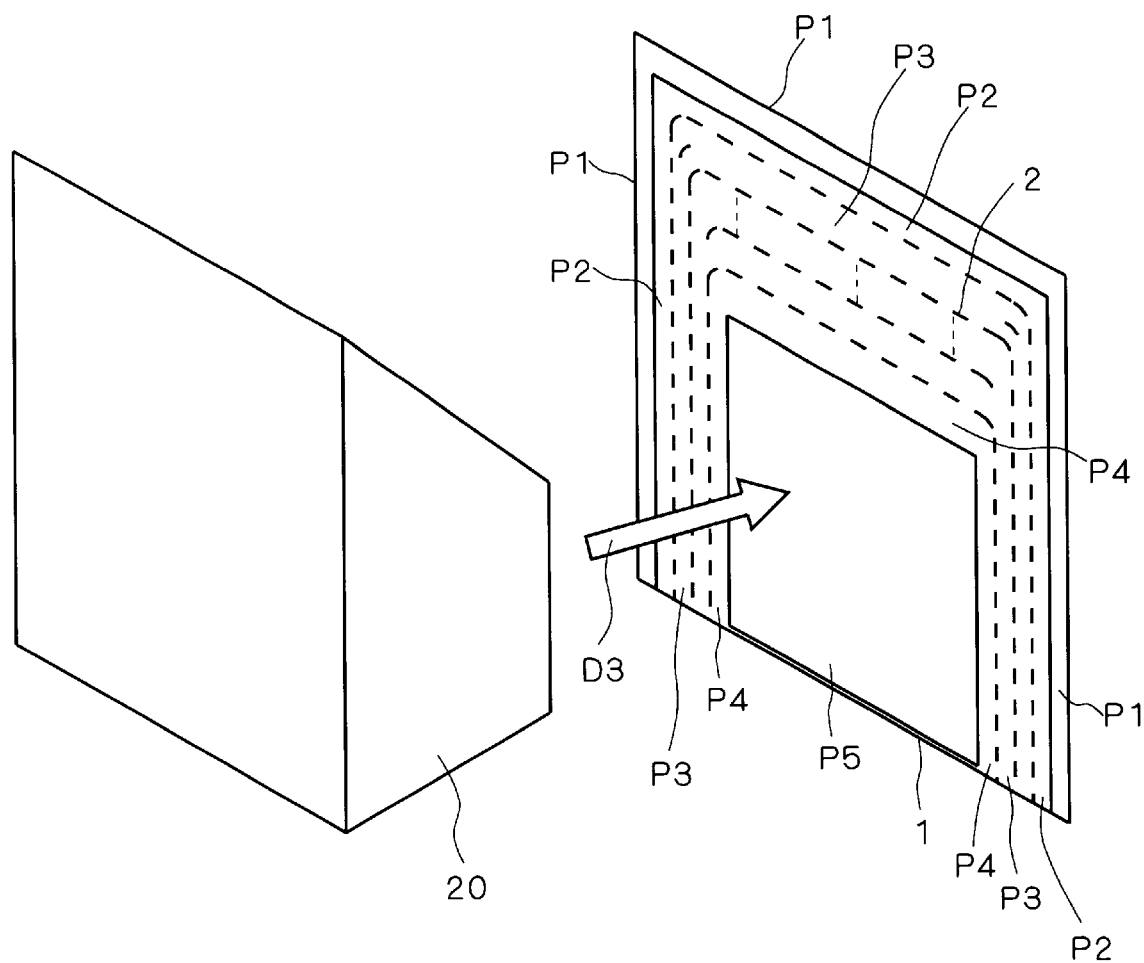
FIG. 4 is a perspective view showing a process for manufacturing a three-dimensional structure using the metal plate according to the first embodiment.
Figure 5:
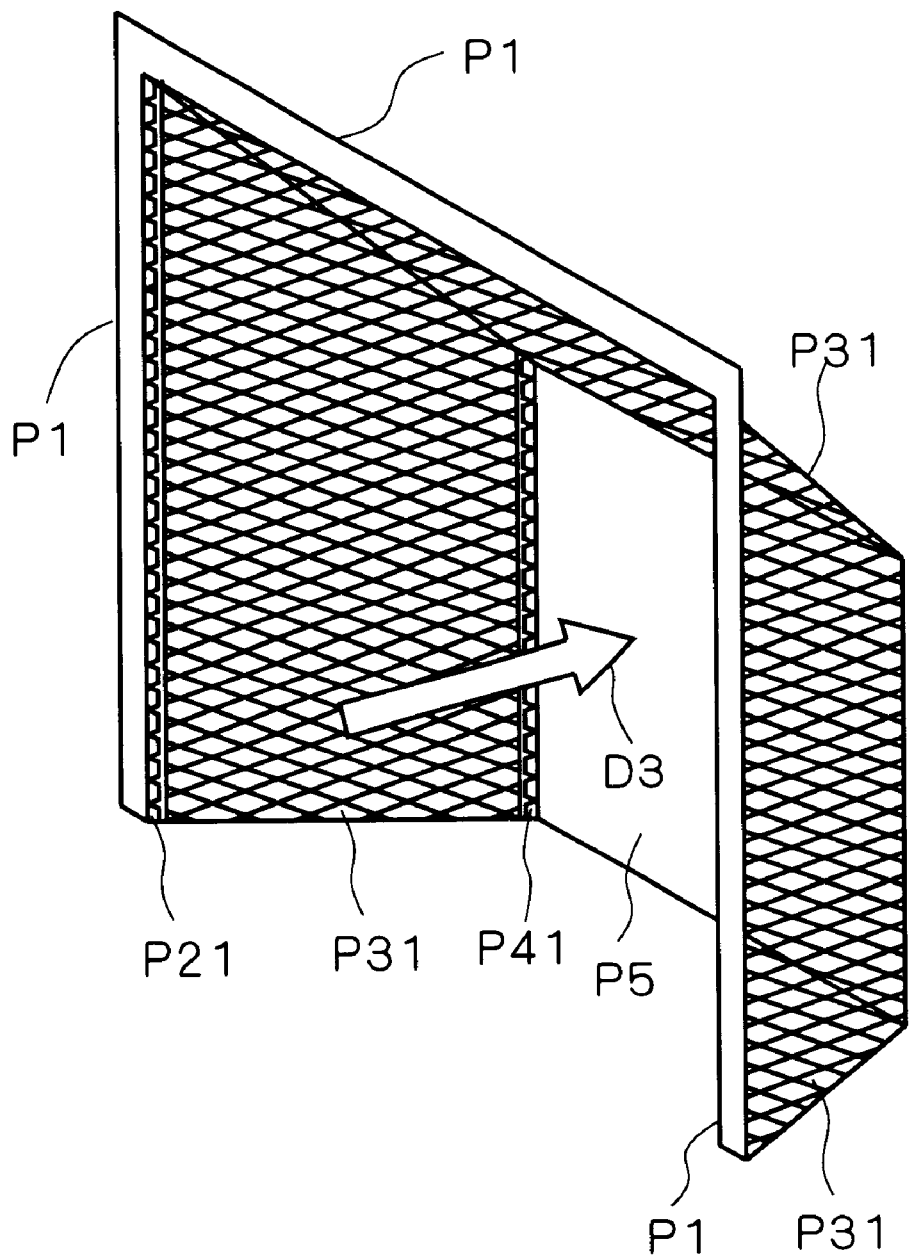
FIG. 5 is a perspective view showing the process for manufacturing a three-dimensional structure using the metal plate according to the first embodiment.

As shown in FIG. 4, next, the die 20 is moved and an upper part of the die 20 is pushed against one of faces of the fifth portion P5 of the metal plate 1 or a back face thereof. Moreover, the die 20 is moved in a third direction D3 (corresponding to a direction of a normal of the face of the fifth portion P5) which is orthogonal to the first direction D1 and the second direction D1, thereby extruding the fifth portion P5 of the metal plate 1 in the third direction D3. By the extrusion, each cut 2 of the third portion P3 is extended in the third direction D3 so that the third portion P31 obtained after the extension is processed into a meshed portion. Consequently, a three-dimensional structure 10 to be a radio wave shield housing is fabricated as shown in FIG. 5. In addition, as shown in FIG. 3, each connecting portion 31 of a second portion P21 and a fourth portion P41 is also contracted in a direction of contraction of the cuts 21 and 2A1 so that each opening 41 absorbs a strain and is deformed. As a result, the second portion P21 and the fourth portion P41 can effectively inhibit the deformation caused by the extrusion in the third direction D3 from reaching the first portion P1 and the fifth portion P5 after the extension, thereby preventing a wrinkle from being generated in the first portion P1 and the fifth portion P5, respectively.

(Variant)

Figure 6:
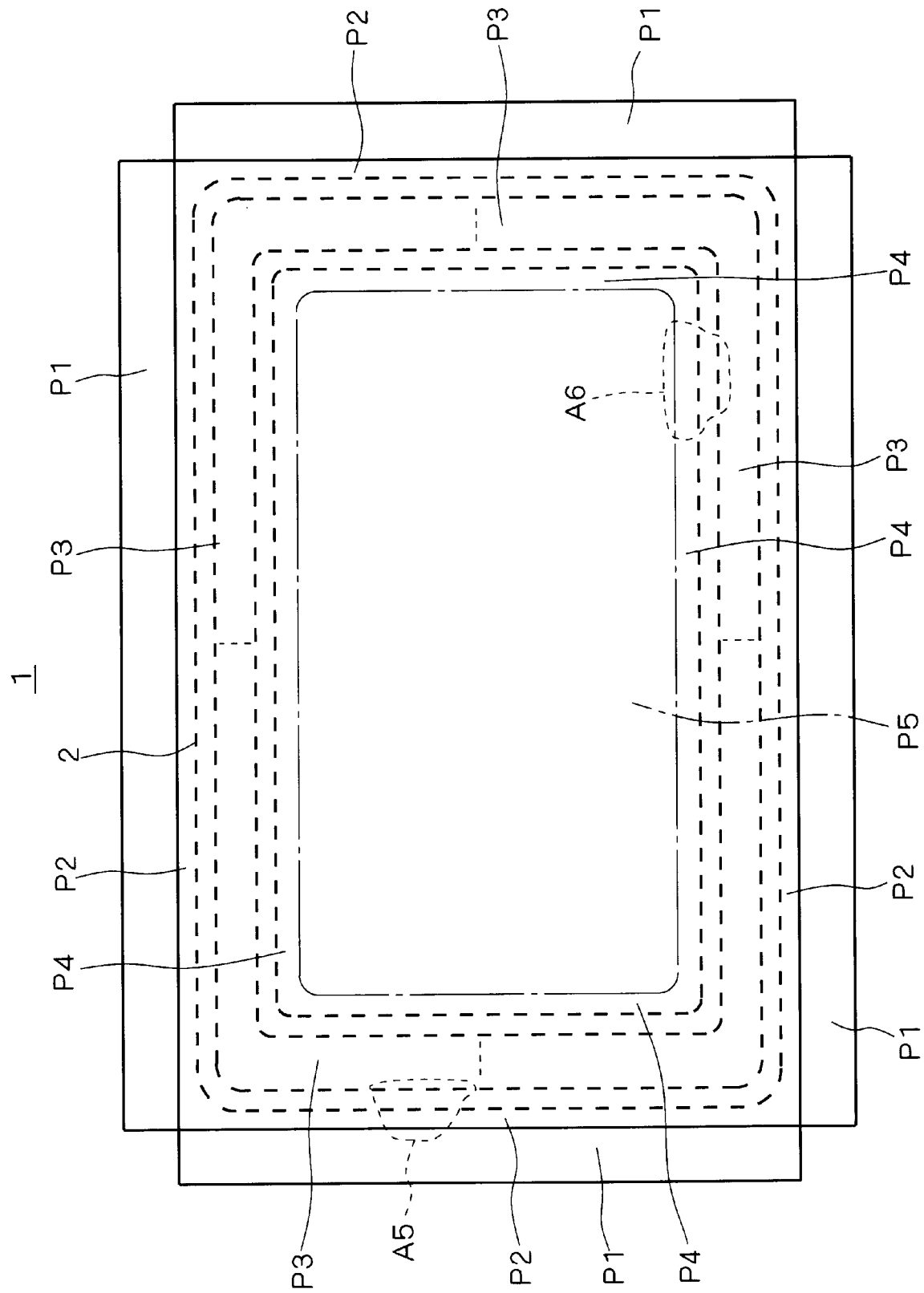
FIG. 6 is a plan view schematically showing a structure of a metal plate according to a variant of the first embodiment which has not been extended.

FIG. 6 is a plan view showing a structure of a metal plate 1 to be used for manufacturing a radio wave shield housing to be a three-dimensional housing according to another example. The metal plate 1 in FIG. 6 has the same structure as that of the metal plate 1 in FIG. 1 and is constituted by each of a first portion P1 to a fifth portion P5. The metal plate 1 is different from the metal plate 1 in FIG. 1 in that the first portion P1 is constituted by four parts and the second portion P2 to the fifth portion P5 are completely surrounded by the four first portions P1. Accordingly, specific structures of broken line portions A5 and A6 in FIG. 6 are also shown in FIG. 2. More specifically, the second portion P2 has the first connecting portions 3 and the first openings 4 shown in FIG. 2, the fourth portion P4 also has the second connecting portions 3 and the second openings 4 shown in FIG. 2, and the third portion P3 is provided with a large number of cuts 2 arranged like a zigzag. Both of the first portion P1 and the fifth portion P5 are non-extension portions which do not have the cut 2 at all.

Figure 7:
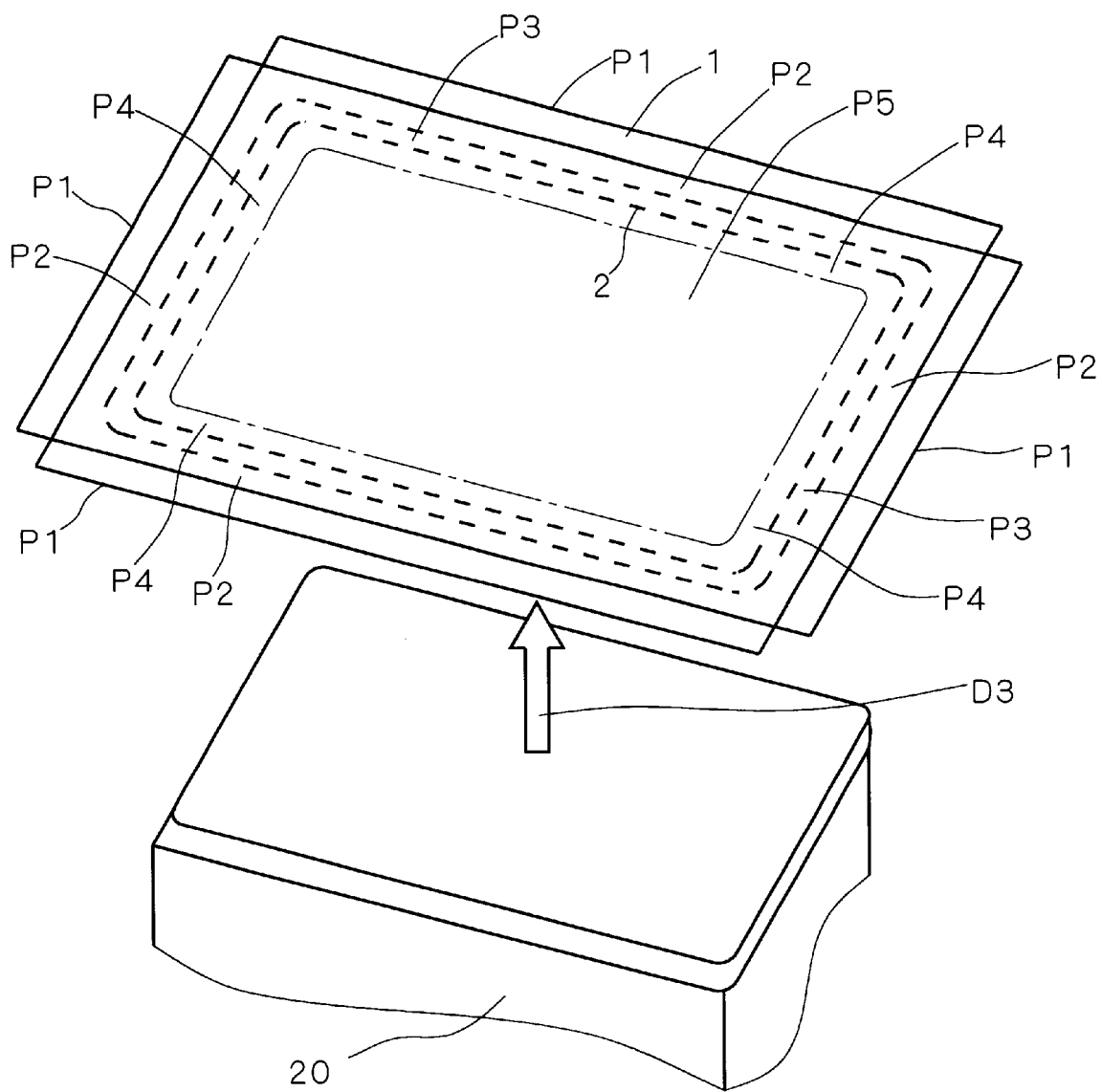
FIG. 7 is a perspective view showing a process for manufacturing a three-dimensional structure using the metal plate according to the variant of the first embodiment.

As shown in FIG. 7, next, the fifth portion P5 of the metal plate 1 in FIG. 6 is extruded in a third direction D3 to be a direction of a normal of a face of the fifth portion P5 through an upper part of a die 20 such as a press machine. Consequently, the third portion P3 of the metal plate 1 in FIG. 6 is extended by a predetermined amount. A three-dimensional structure thus obtained is a radio wave shield housing 10 of an electronic device 100 shown in FIG. 8.

Figure 8:
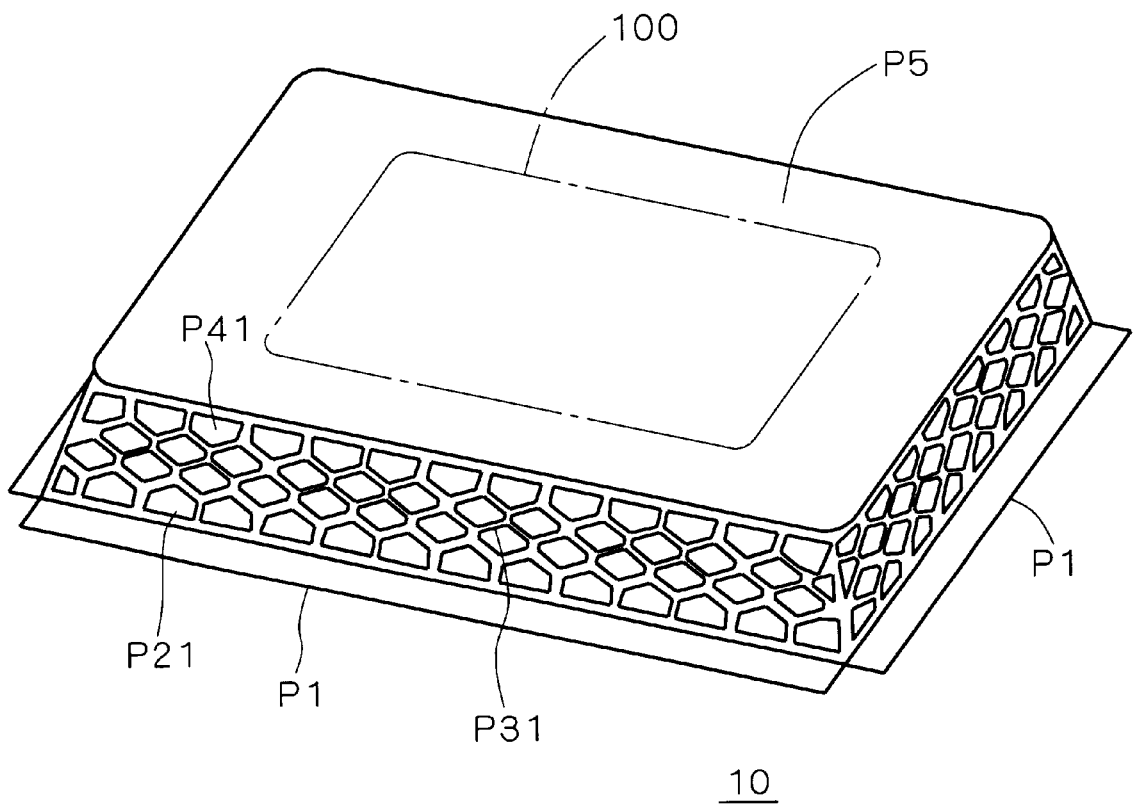
FIG. 8 is a perspective view showing the process for manufacturing a three-dimensional structure using the metal plate according to the variant of the first embodiment.
Figure 9:
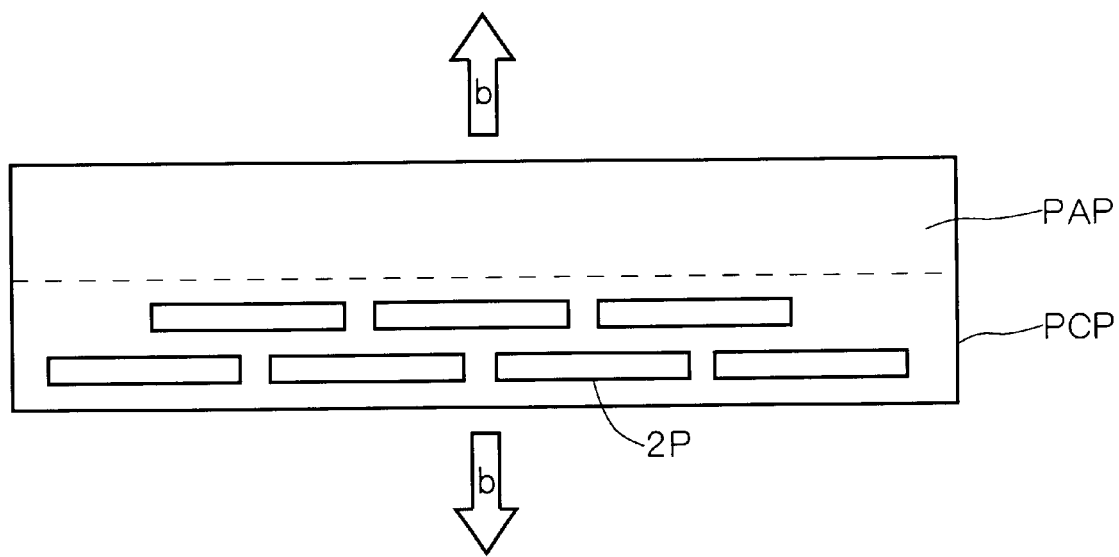
FIG. 9 is a plan view schematically showing a structure of a boundary portion of an extension portion and a non-extension portion in a conventional metal plate which has not been extended.

Also in the present variant, as described above, a second portion P21 and a fourth portion P41 in the three-dimensional structure 10 of FIG. 8 can effectively inhibit the first portion P1 and the fifth portion P5 from being wrinkled, thereby preventing an inner peripheral edge portion of the first portion P1 and an outer peripheral edge portion of the fifth portion P5 from being contracted, respectively.

(Addition)

While the embodiment of the present invention has been disclosed and described in detail, the above description illustrates applicable aspects of the present invention and the present invention is not restricted thereto. In other words, various modifications and variants for the described aspects can be considered without departing from the scope of the invention.

INDUSTRIAL APPLICABILITY

The three-dimensional structure according to the present invention can be utilized for various housings of electronic devices. For example, the present three-dimensional structure can be used as a radio wave shielding member for shielding an electromagnetic wave emitted from an electronic device.

What is claimed is:

1. A metal plate to be used for manufacturing a three-dimensional structure through three-dimensional extension, comprising:

a first portion which does not have cuts at all; a second portion connected to said first portion; and a third portion connected to a portion in said second portion on an opposite side of a boundary line of said first portion and said second portion and having said cuts arranged like a zigzag in a first direction parallel with said boundary line, said second portion comprising:

a plurality of connecting portions extended in a second direction orthogonal to said first direction on the same plane and connecting a portion in said second portion on said boundary line side and said third portion; and a plurality of openings arranged in said first direction, each of which is interposed between connecting portions adjacent to each other out of said plurality of connecting portions.

2. The metal plate according to claim 1, further comprising:

a fourth portion which is connected to a portion in said third portion on an opposite side of a connecting portion of said second portion and said third portion; and a fifth portion which is connected to a portion in said fourth portion on an opposite side of a connecting portion of said third portion and said fourth portion and does not have said cuts at all, wherein said plurality of connecting portions and said plurality of openings in said second portion are defined as a plurality of first connecting portions and a plurality of first openings, respectively, and said fourth portion comprises:

a plurality of second connecting portions extended in said second direction and connecting said opposite side portion of said third portion to a portion in said fourth portion on a boundary line side of said fourth portion and said fifth portion; and a plurality of second openings arranged in said first direction, each of which is interposed between second connecting portions adjacent to each other out of said plurality of second connecting portions.

3. The metal plate according to claim 2, wherein:

said plurality of first connecting portions are provided at an equal pitch, an end on said third portion side of each of said plurality of first connecting portions is positioned above a central part of an edge in said first direction of a first cut which is the closest to said opposite side portion of said second portion out of said cuts, said plurality of second connecting portions are provided at an equal pitch, and an end on said third portion side of each of said plurality of second connecting portions is positioned above a central part of an edge in said first direction of a second cut which is the closest to said connecting portion of said third portion and said fourth portion out of said cuts.

4. The metal plate according to claim 3, wherein, a shape of each of said plurality of first connecting portions is a rectangular parallelepiped, a sectional shape of each of said plurality of first openings is a rectangle, a shape of each of said plurality of second connecting portions is a rectangular parallelepiped, and a sectional shape of each of said plurality of second openings is a rectangle.

5. A method of manufacturing a three-dimensional structure, comprising the steps of:

preparing the metal plate according to claim 3; and extruding said fifth portion of said metal plate in a third direction orthogonal to said first direction and said second direction to extend said cuts, thereby processing said third portion into a meshed portion.

6. A three-dimensional structure manufactured by the method of manufacturing a three-dimensional structure according to claim 5.

7. An electronic device comprising:

an electronic device body; and a radio wave shielding member constituted by the three-dimensional structure according to claim 6.

* * * * *

UNITED STATES PATENT AND TRADEMARK OFFICE
CERTIFICATE OF CORRECTION

PATENT NO. : 6,700,059 B1
DATED : March 2, 2004
INVENTOR(S) : Enmoto et al.

It is certified that error appears in the above-identified patent and that said Letters Patent is hereby corrected as shown below:

<u>Title page,</u>
Item [22], PCT Filed:, "December 19, 2001" should read -- June 21, 2000 --.

Signed and Sealed this

Twenty-seventh Day of July, 2004

JON W. DUDAS
*Acting Director of the United States Patent and Trademark Office*